United States Patent [19]
Larsen

[11] Patent Number: 5,422,599
[45] Date of Patent: Jun. 6, 1995

[54] SINGLE-ENDED, TRANSFORMER COUPLED AUDIO AMPLIFIERS

[76] Inventor: Lawrence E. Larsen, 308 Hamilton Ave., Silver Spring, Md. 20901

[21] Appl. No.: 92,485

[22] Filed: Jul. 16, 1993

[51] Int. Cl.6 .............................................. H03F 3/00
[52] U.S. Cl. .................................................. 330/196
[58] Field of Search .............................. 330/165-168, 330/171, 188-190, 195-197

[56] References Cited

U.S. PATENT DOCUMENTS 2,895,019  2/1994  Farger ................................. 330/197

Primary Examiner—James B. Mullins

[57] ABSTRACT

A single ended audio amplifier having at least two primary windings, not necessarily matched, in the primary of an output matching transformer: one for the amplifier final stage; and another winding to produce in the same core a magnetizing force equal and opposite for out-of-band currents. Primary among these is quiescent current, but subsonic anode current variations due to signal or drift of operational conditions may be cancelled as well. A sensor tracks the quiescent and subsonic currents of the output amplifier device. The sensor output is low-pass filtered to control a three terminal current regulator that drives the second coil to oppose the out-of-band anode currents in the first (signal) coil of output transformer primary. Thus, the current in the first primary winding is controlled by the transconductance of the amplifier device; and the current in the second primary winding is controlled by a voltage controlled current regulator, the control voltage tracking the current in the first winding over various operational conditions to accomplish magnetic cancellation for quiescent and subsonic components of anode current in the first coil of the output transformer.

12 Claims, 2 Drawing Sheets

SINGLE-ENDED, TRANSFORMER COUPLED AUDIO AMPLIFIERS

This application is based on Disclosure #286889 filed on 17 Jul. 1991.

INVENTOR: Lawrence E. Larsen, Silver Spring, Md.

U.S. PATENT CITED

U.S. Pat. Nos. 1,329,283; Arnold, 1920.
U.S. Pat. Nos. 1,448,550; Arnold, 1923.
U.S. Pat. Nos. 1,809,879, Whittle, 1931.
U.S. Pat. Nos. 2,248,906; Blumlein, 1940.
U.S. Pat. Nos. 2,646,467; McIntosh, 1953.
U.S. Pat. Nos. 2,710,312; Hafler, 1957.
U.S. Pat. Nos. 2,815,408; Hafler, 1957.
U.S. Pat. Nos. 2,895,019; Farber, 1959.
U.S. Pat. Nos. 4,614,914; Hofer, 1989.

OTHER REFERENCES CITED

Crowhurst, N., Leakage inductance, *Electronic Engineer*, 21.254 p 129 et seq, April 1949.

Crowhurst, N., Winding capacitance, *Electronic Engineer*, 21.261 p 417 et seq, November 1949.

Hanna, Design of reactances and transformers which carry direct current, *Trans Am Inst Elec Eng*, 46:155, 1927.

Hewlett-Packard, Application Note 951-2, Linear Applications of Optocouplers, HP 5954-8430 (April/1987).

Legg, Optimum air gap for various magnetic materials in cores of coils subject to superimposed direct current, *Trans Am Inst Elec Eng*, 64 (10): 709, 1945.

Moir, J., *High Quality Sound Reproduction*, 2nd Ed, MacMillan, London, 1961.

MIT Staff, *Magnetic Circuits and Transformers*, John Wiley and Sons, New York, 1943.

Paterson, W., Harmonic production in ferromagnetic materials at low frequencies and low flux densities, *Bell System Technical Journal*, pp 762–796, 1929.

Partridge, G., The inductance of iron-cored coils having an air gap, *Phil Mag S.* 7. VOl 22, No. 148. pp 665–678, 1936.

Partridge, N., Harmonic distortion in audio frequency transformers, *Wireless Engineer*, 19.228 p 394 et seq; 19.229 p 451 et seq; 19.230 p 503 et seq, September, October, November, 1942a, b, c.

Terman, F. *Radio Engineering*, 3rd edition, p 248, McGraw Hill, 1947.

Thompson, B. J., *Proc IRE*, 27:591, 1993.

Van der Bijl, *Thermionic Tube Amplifiers*, McGraw-Hill, 1920.

Warner, J. C., and Loughren, A. V., The output characteristics of tubes, *Proc IRE* pp 735–757, 1927.

AREA OF THE INVENTION

A single ended audio frequency amplifiers are in the midst of a renaissance for high fidelity application as new importance is placed upon the spectral distribution of harmonic products rather than reduction of total harmonic distortion (THD) without regard for its effect on spectral distribution. The desired distortion format is a monotonic decline of spectral amplitude with order. Historically, single ended amplifiers were supplanted by push-pull amplifiers [Colpitts, E. H., as cited by Van der Bijl, 1927] because of the greater power efficiency of the latter, especially for bias conditions (such as $AB_1$) that provide conduction angles just larger than pi. The composite transfer characteristic [Thompson, 1933] of push-pull amplifiers permits low THD since even ordered harmonic distortion products are cancelled for matched output devices. For example, as known to those skilled in the art, the cancellation of even order distortion products with push-pull amplifiers depends upon matched transfer characteristics of the out-put devices plus equal and opposite drive by the phase splitter. It does not depend upon magnetic properties as is the case with bias current cancellation. Since the major contributor to THD is the second harmonic, THD is certainly reduced; but the odd ordered products, especially 3rd and 5th, now dominate the spectral distribution. This defect cannot be corrected with negative feedback. Negative feedback reduces lower order harmonics more than higher order harmonics. The distortion format may have 9th and 11th orders greater than 5th and 7th, and odd order amplitudes still exceed the even. It is often argued that these high orders may be beyond the range of audibility, but intermodulation effects produce difference frequencies in the audible range. Furthermore, both distortion format and THD vary with load impedance [Moir, 1961]. Although this is also a function of the equivalent series resistance of the amplifier device, it is subject to alteration with various feedback arrangements such as the ultra-linear [Blumlein, 1940] or Williamson configuration [Hafler, 1957], cathode taps per McIntosh [1953]; and, most recently, by the use of negative output impedance by Hofer [1989]. Nevertheless, push-pull operation is far more sensitive to optimal load impedance than is single ended operation [Partridge, 1942c]. This is particularly pertinent for high fidelity applications because of the reactive nature of loud speaker loads. Frequency dependant magnitude and phase of the load are reflected back into the primary and effect the load path of the amplifier device.

In high fidelity applications, therefore, single-ended operation is preferred in order to obtain the desired distortion format and to reduce power amplifier sensitivity to load impedance. The disadvantages of traditional single-ended operation are lower power efficiency, greater sensitivity to power supply hum, and unbalanced magnetomotive force in the matching transformer due to bias currents for the output amplifying device. The instant invention seeks to improve upon the last of these three factors; in the process, the second factor is ameliorated as well.

It is well known to those skilled in the art that unbalanced direct currents are undesirable in matching transformers because the hysteresis curve that relates magnetizing force (H) to magnetic flux density (B) is shifted and becomes asymmetrical. Consequently, the maximum permissible flux density, thus output power, must be reduced as the transformer core more easily reaches saturation. Likewise, the hysteresis curve introduces distortion by virtue of nonlinear primary currents that can flow in the series equivalent source impedance of the amplifier device [Partridge, 1942 a,b,c]. In the case of balanced DC, this iron induced distortion is largely odd-order, especially 3rd harmonic; but in the presence of unbalanced DC, even-ordered products are also introduced.

Furthermore, unbalanced DC in the primary reduces the inductance of the primary winding. This effect is quite sensitive as laboratory measurements of modern matching transformers disclose a 40–50% drop in primary incremental inductance with only 1 Ma of unbalanced DC. This translates directly into increased distortion as shown by Partridge (1945).

Still further, insofar as flux density varies inversely with frequency, the power bandwidth is reduced for a specified distortion. That is, the low frequency cut-off (with respect to mid-range frequencies) is shifted to a higher frequency in comparison to the result with no unbalanced DC in the primary windings. The phase angle of the load presented to the output device departs progressively from zero as the primary inductance falls. The load line then becomes an ellipse of increasing aspect ratio as the frequency drops. Thus, the distortion increases and its format alters as the load ellipse intersects regions of the characteristic curves that include higher order terms.

Heretofore, single ended amplifiers with output transformers employed one of three techniques to ameliorate the effects of unbalanced DC currents: 1) shunt feed of the output transformer that blocks DC with a coupling capacitor as disclosed by Arnold in U.S. Pat. No. 1,448,550 [1923]; 2) interposition of an air gap in the magnetic circuit [MIT Staff, 1942, Partridge, 1942c]; 3) an auxiliary coil for magnetic cancellation of bias currents in the core of the output transformer. Two variations of the latter exist based on how such a coil is energized. The first variation as disclosed by Whittle in U.S. Pat. No. 1,809,879 [1931] employed a fixed resistor between the anode bias supply and ground to match the equivalent series resistance of the anode. The second variation as disclosed by Farber in U.S. Pat. No. 2,895,019 [1959] employed a matched pair of coils, both of which carry anode current; but only one carries bias and signal components of the anode current whereas signal components are shunted or blocked from the other coil by power level filters.

None of these is fully satisfactory. It is an objective of the instant invention, therefore, to reduce magnetizing force outside of the pass band, e.g. bias currents and variations thereof or subsonic signals, in single ended amplifiers with transformer coupled output. This is accomplished without the use of an air gap in the matching transformer, or a substantially fixed bucking current, or power level filters of the prior art along with their defects as enumerated below. Rather, anode current in a first or signal coil is tracked to control a bucking current in an second coil, not necessarily matched to the first coil. Magnetic cancellation of out-of-band magnetizing force in the core of the output transformer is accomplished over a range of operational, drift and signal conditions. Still another objective is to reduce output coupling transformer core size and weight in comparison to air-gapped designs of the same power bandwidth. Still further objectives are to reduce leakage inductance, and to reduce iron-induced distortion in comparison to air-gap magnetic circuits of the same size and weight for output transformers of single-ended amplifiers. Still another objective is to reduce the propensity of single ended amplifier to saturate the core of the output transformer by subsonic signals. Since flux density varies inversely with frequency, subsonic drive reduces the maximum power available in the audible regions of the spectrum for a fixed distortion specification.

Prior art single ended designs are sensitive to anode power supply ripple. Power supply ripple is effectively plate current modulation that appears in the audio output. In a push-pull design, the fact that power supply ripple is in-phase at the anodes of two amplifier devices connected at opposite ends of two coils wound in series on the same core, leads to magnetic cancellation. Unlike the case with even-ordered harmonics, the offending signal is applied to the anode directly and not to the control electrode. The instant invention accomplishes reduction of ripple sensitivity by similar means when amp-turns are equal and opposite. This advantage of the instant invention offers considerable economy in comparison to traditional single ended amplifiers. Ripple rejection filters are large and costly for the high anode voltages and large quiescent currents encountered in practice with class A bias.

Lastly, from the perspective of power supply utilization, it is advantageous that the instant invention be embodied with unequal windings in the signal and bucking coils. Since the objective is magnetic cancellation via equal but opposite magnetomotive force, less current for the bucking coil can be compensated by greater number of windings. Furthermore, since the high frequency limitations normally associated with more turns are not pertinent to the band width of the bucking coil, there is no need to interleave windings on the bucking coil. In principle, doubling the number of windings on the bucking coil will allow reduction of current in that coil by one-half.

SUMMARY OF THE INVENTION

The instant invention retains the advantages of single ended operation, notably the monotonic decline of spectral amplitude of distortion products with order, without the disadvantages of unbalanced direct currents in the primary of the output matching transformer. This is accomplished by the use of at least two primary windings, not necessarily matched, in the primary of the output matching transformer: one for the amplifier final stage; and another winding to produce in the same core a magnetizing force equal and opposite for out-of-band currents. Primary among these is quiescent current, but subsonic anode current variations due to signal or drift of operational conditions may be cancelled as well. A sensor tracks the quiescent and subsonic currents of the output amplifier device. Said sensor output is low-pass filtered to control a three terminal current regulator that drives the second coil to oppose the out-of-band anode currents in the first (signal) coil of output transformer primary. Thus, the current in the first primary winding is controlled by the transconductance of the amplifier device; and the current in the second primary winding is controlled by a voltage controlled current regulator, said control voltage tracking the current in the first winding over various operational conditions to accomplish magnetic cancellation for quiescent and subsonic components of anode current in the first coil of the output transformer. In the case of power beam tubes, cathode current cannot directly substitute for anode current. That is to say, neither screen grid nor control grid current contribute to magnetomotive force of the first coil. Only anode current is pertinent to cancellation of the magnetomotive force due to bias and subsonic signals in the primary of the output transformer. For the case of triode tubes operated exclusively in class $A_1$ (no grid current), cathode current may be substituted for anode current. A current sensor in the cathode circuit may serve as a proxy for anode current under these conditions. Output from such a current sensor is an analog for magnetomotive force if the number of turns in the related coil are known, or are equal to a second coil, and the core is of uniform cross-section through the two coils. The required condition is equal amp-turns in the two coils plus opposite magnetic field sense. Cathode circuit location of the current sensor has numerous practical advantages as well become evident in later paragraphs. Lastly, practice of the instant invention may reduce amplifier sensitivity to power supply ripple in comparison to traditional single ended designs.

DISTINCTIONS OF THE INSTANT INVENTION OVER PRIOR ART

1. Shunt Feed Transformer

The shunt feed of an output coupling transformer as disclosed by Arnold [U.S. Pat. No. 1,448,550] is disadvantaged by the requirement for a power level blocking capacitor. The capacitor must withstand anode potentials as high as a few thousand volts. This, in combination with the need for a low-frequency cut-off (−1 Db with respect to mid-band) in the 20 to 30 Hz range, results in a very large and costly capacitor. Furthermore, the coupling capacitor and inductance of the primary winding constitute a series resonant circuit with phase effects that extend well into the audio band [Terman, 1947]. Finally, an additional inductor is needed in series with the anode bias supply to block signal currents from the supply. In order to be effective, such an inductor must present at least twice the inductance of the primary of the coupling transformer at the lowest frequency in the pass-band. This is a large inductor which also must be insulated for the full anode voltage.

2. Air Gapped Magnetic Circuit

An air-gap in the magnetic circuit of the output coupling transformer increases the maximum permissible flux density, in comparison to ungapped magnetic circuits; but this is accomplished at the expense of reduced primary inductance since the effective core permeability is reduced. Primary inductance is then restored by the use of a larger core and/or more primary windings. This step exacerbates the iron-derived distortion as more primary windings act to increase primary resistance and to increase both leakage inductance as well as stray capacitance. These combine to degrade power handling and to roll-off the high frequency end of the pass band, respectively. While leakage inductance can be ameliorated by winding to interleave primary and secondary coil segments [Crowhurst, 1949a], stray capacitance is necessarily increased with the net effect that a high frequency peak is introduced. This may be reduced with the use of vertical sections in the winding [Crowhurst, 1949b]; but compromise is inevitable. The phase angle of the load at the high end of the pass band effects distortion due to elliptical load paths, just as at the low frequency end of the pass band. Furthermore, the use of air gaps is predicated on a optimization of gap dimensions, desired primary inductance, DC current and core material [Hanna, 1927; Legg, 1945]. If the magnetizing force is too high, permeability falls precipitously. This limits the utilization of such transformers to a narrow design range; thus, many magnetic designs are needed for various conditions of operation.

3. Fixed Current Regulation in a Bucking Coil

Whittle disclosed [U.S. Pat. No. 1,809,879] a circuit in which a main coil carries amplifier bias and signal currents while an equal and opposite magnetomotive force was produced by an auxiliary coil by means of substantially fixed direct current. Said direct current is established by a fixed resistor positioned between the anode bias supply connected to the auxiliary coil and the common point of the amplifier final stage. The anode bias supply is on the high side of both the auxiliary coil and the main coil. The amplifier is on the low side of the main coil and the fixed resistor is on the low side of the auxiliary coil. Thus, the amplifier final stage controls the current in the main coil and the fixed resistor controls the current in the auxiliary coil. If the number of turns of the main and auxiliary coil are equal and on the same core, the value of the fixed resistor is selected to be equal to the equivalent anode resistance of the amplifier device. If unequal numbers of turns are used, a preferred embodiment, the fixed resistor is altered proportionately to maintain equal amp-turns on the core.

As a result of the fixed resistor to control current in the auxiliary coil, Whittle's circuit is able to provide magnetic cancellation at only one point of operation for the amplifier device. It is well known that the equivalent plate resistance of a thermionic vacuum tube amplifier changes with the quiescent operating point [Warner and Loughren, 1927]. Typical values of equivalent plate resistance for the GL-845 (a large, power triode) vary between 1650 and 1950 ohms for class A bias on load lines selected to minimize distortion. As known in the art, the characteristic curves are a family of plate current vs plate-to-cathode voltage for various values of grid-to-cathode voltage. In general, the equivalent plate resistance is the first derivative of the plate current as a function of plate voltage and grid voltage. This slope varies with all three parameters. It is clear, therefore, that the teaching of Whittle in U.S. Pat. No. 1,809,879 cannot accomplish the objective of magnetic cancellation of bias currents over any range of operational conditions, neither can drift in the bias point nor subsonic signals be accommodated.

The structural differences of the instant invention in comparison to Whittle are that the instant invention uses a voltage controlled current regulator to drive the auxiliary coil, not a fixed resistor. The frequency response of the low-pass filter for the control voltage sets the cut-off frequency and rate of attenuation in the stop-band at low voltage and low power to allow magnetic cancellation of both DC and subsonic components of the anode current without power level filters. The bucking current in the auxiliary coil tracks the anode current in the main coil; thus, magnetic cancellation is not limited to one preselected equivalent plate resistance.

4. Power Filtered Anode Current in Matched Coils

The use of a matched pair of primary windings by Farber [U.S. Pat. No. 2,895,019] relates to the instant invention; but both coils are in the anode/cathode current path. Since both coils see the total plate/cathode current, either in series or equally divided in parallel, one coil must be decoupled from signal currents to retain only the bias currents while the other coil, the main coil in Whittle's nomenclature, carries both signal and bias currents. Thus, either a shunt capacitor (series configuration) or a blocking inductor (parallel configuration) is employed with one coil. Therefore, the same criticisms as for the shunt feed output transformer apply: difficulty of filtering at high voltage and high current, e.g. large and costly capacitors for anode voltages in the range of a few thousand volts and blocking reactors that must have large inductance in comparison with the coil on the core of the output transformer; and resonant circuit effects whereby the inductance of the shunted coil and the shunting capacitor comprise a parallel resonant circuit. Furthermore, unlike Whittle, Farber requires that the two coils be matched. This requirement leads to a defect in operability for the parallel case shown in Farber's FIG. 3: Note that the anode is at the center tap of the primary winding. One primary coil, 16, is returned directly to the anode bias supply; but the other primary coil, 14, is returned through series inductor 26 to block AC. The resistance of the path with coil 14 and inductor 26 must be higher than the path with coil 16 since the coils 16 and 17 are matched. Since both paths are connected to the plate of tube 10, the plate current must divide unequally between the two paths. Thus, the magnetomotive forces cannot be equal, although they can oppose, in coil 14 and 16.

The structural differences of the instant invention as compared to Farber are that in the instant invention only one coil carries the anode current; and there is no requirement for matched coils. Anode current in the first coil is sensed and low-pass filtered at low voltage and low current to become a control voltage for a voltage controlled current regulator that supplies current to the second coil. No power level inductor or capacitor are needed to prevent alternating currents in the second coil. Since the second coil need not be matched to the first coil, the second coil may have greater number of turns with proportionately lower current to match only the amp-turns, assuming equal core area for each leg.

These and other advantages of the instant invention will be evident to those skilled in the art of audio amplifier design upon study of the drawings and descriptions thereof to follow.

DETAILED DESCRIPTION OF THE DRAWINGS

Figure 1:
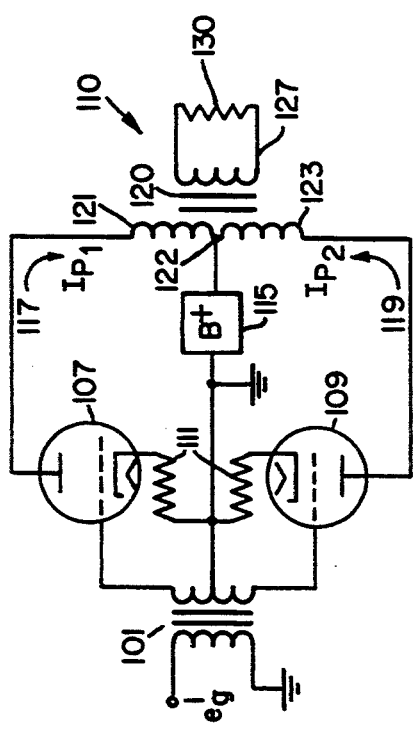
FIG. 1 is a schematic drawing of prior art in push-pull amplifier configuration where it is understood that the transfer characteristics of the output amplifier devices are matched as are the magnetizing forces of the two primary windings. The bias current cancellation is indicated by the two current loops of opposite sense.

FIG. 1 represents a typical prior art embodiment of a push-pull amplifier comprised of an input transformer 101 to provide AC coupling and phase splitting of the input signal, $e_g$. The two power amplifier devices, 107 and 109, are cathode biased and balanced by a resistive network, 111. The anode voltage is applied to each plate via the center tap 122 of the output matching transformer 110. The electronic bias current, 117, of device 107 flows from its cathode, to its anode, to the primary winding 121 of 110, to the center tap 122, thence to ground via anode bias supply 115. The bias current 119 of power amplifier device 109 flows from its cathode to its anode, through the second primary winding 123 on the same core, 120, of 110 to also reach the center tap 122, thence ground return via anode bias supply 115. Note that the bias current 117 of the upper device, 107, follows a clockwise loop in the circuit whereas the bias current 119 of the lower device, 109, follows a counter-clockwise loop. Thus, these currents produce magnetic fields of opposite sense in core 120. By virtue of this condition, the two DC bias currents produce cancellation of the magnetic field in output matching transformer 110. Signal currents are in phase opposition, however, prior to application to the control electrode of the final amplifier devices; thus, the signal currents do not cancel in the core. If, after amplification, the signal is resolved into a fundamental ($f_1$) and a series of harmonics of even ($f_2$, $f_4$, ...) and odd ($f_3$, $f_5$, ...) order, neither the fundamental nor the odd ordered harmonics are cancelled; but the even ordered harmonics are cancelled. Thus, only the fundamental and odd ordered harmonics appear in the secondary winding, 127, and the load 130.

Figure 2:
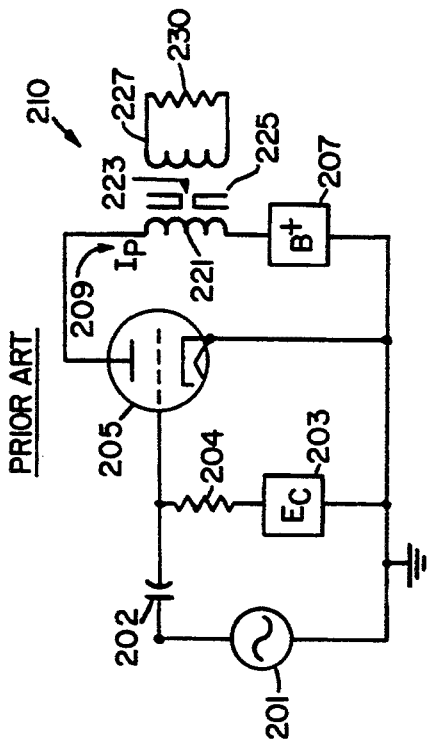
FIG. 2 is a schematic representation of prior art in single-ended amplifier with unbalanced bias current. In this case, the core contains an air gap to prevent core saturation by the unbalanced DC.

FIG. 2 is a conventional, prior art single ended amplifier shown with the input signal 201 applied to the control electrode of amplifier 205 via coupling capacitor 202 with a fixed grid bias supply, $E_C$, 203 acting through grid resistor 204. Grid drive that exceeds $E_C$ on positive peaks, will cause grid current. The total space charge current is partitioned between the anode and the grid. Only that portion of the total space charge captured in the anode, indicated by the arrow 209, flows through primary winding 221 of output transformer 210. . The anode bias supply 207 in combination with grid bias supply 203 establishes an electronic bias current 209 that flows from cathode to anode of 205, then through primary winding 221 to ground return via the B+ supply, 207. The core, 225, of transformer 210 is gapped at 223 to ameliorate core saturation produced by bias current 209. This reduces the effective permeability of the core; thus, the primary inductance is reduced and the low frequency cut-off is raised to reduce the pass-band for a given distortion specification in comparison to the case where no unbalanced, out-of-band magnetomotive force exists. After amplification, the signal is presented by a fundamental and harmonics that decline monotonically with order. This format is retained in the secondary 227 and load 230.

Figure 3:
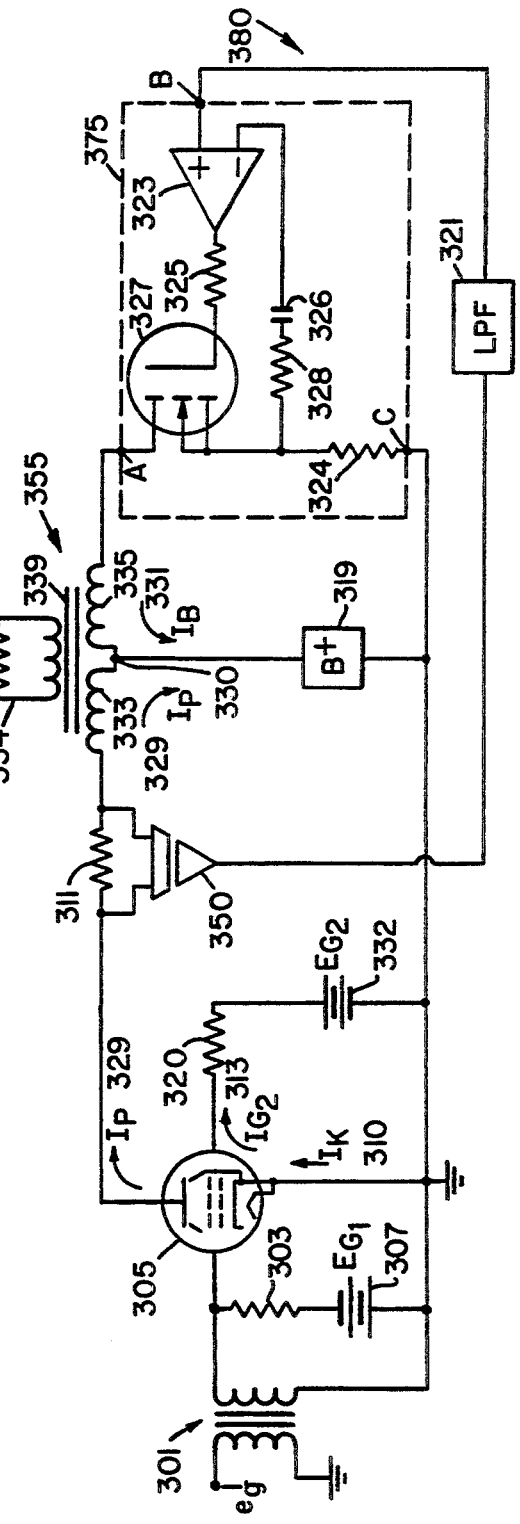
FIG. 3 illustrates an embodiment of the instant invention with a tetrode tube as the final stage of the single ended amplifier. Anode current is sensed to adaptively cancel, in the output transformer, out-of-band magnetomotive force. Anode current in the first primary coil is cancelled by equal but opposite magnetomotive force induced in a second or bucking coil. The second coil is wound on the same core as the first or signal coil. Current in the bucking coil is determined by a voltage controlled current regulator. The control voltage for said current regulator tracks current flow in the first coil. In this embodiment, anode current sensing is needed to reject screen current and control grid current from the control signal for the current regulator. Anode voltage isolation is accomplished with an isolation amplifier. The current regulator is preferably a MOSFET in common source connection with servocontrolled gate drive to track anode current.

FIG. 3 is a preferred embodiment of the instant invention where anode current is sensed to drive a voltage controlled current regulator in combination with a bucking coil. Beam power tube 305 is driven by input transformer 301. The quiescent plate current for beam power amplifier 305 is established by grid bias supply 307 acting through grid resistor 303, and screen bias supply 332 acting through screen resistor 320. Anode bias supply 319 is connected to the center tap 330 of transformer 355. Cathode current 310 is the sum of all components of the space charge. Two components are screen grid current 313 and plate current 329. Only plate current (electron) 329 flows from ground to the anode supply 319 through center tap 330, first coil 333 of output matching transformer 355, and sense resistor 311 in series with the anode of amplifier 305. The voltage drop across sense resistor 311 is measured by isolation amplifier 350. In differential configuration, the output of 350 is proportional to the bias current 329. After low pass filtering in network 321, said voltage becomes the control signal applied to terminal B of three terminal, voltage controlled current regulator 375. A preferred embodiment of which is comprised of operational amplifier 323, N-channel MOSFET 327, and source resistor 324. The three terminals are indicated by letters A,B, and C at the perimeter of the dashed line that encloses the current regulator assembly, 375. The drain of MOSFET 327 at terminal A is connected to the low end of a second coil 335 wound on the primary of output transformer 355 in such a way that the magnetomotive force in said second coil is in opposition to the magnetomotive force in said first coil for a common center tap 330. Drain current in MOSFET 327 is established by gate drive via operation amplifier 323 wherein the non-inverting input of said operational amplifier, terminal B, is connected to the control voltage 380 from low pass filter 321; and the inverting input of 323 is connected to sense resistor 324, via RC lead network 326 and 328, wherein the low end of sense resistor 324 is connected to the ground return path at terminal C. Resistor 325 limits current drive to the gate of MOSFET 327 whereas said lead network 326/328 limits the band-width of op amp 323 to prevent loop oscillation. An overall feedback loop includes op amp 323 and MOSFET 327 to allow bucking current 331 in coil 335 to track bias current 329 in coil 333 where both coils are on core 339 of transformer 355. Thus, the anode current 329 is tracked by assembly 375 to allow a current 331 to flow in coil 335 that produces a magnetomotive force equal and opposite to that produced by bias current 329 in coil 333 wherein both coils are wound on ferromagnetic core 339. The frequency range of this cancellation in magnetomotive force is determined by the cut-off frequency of low pass filter 321, said cut-off frequency is advantageously set within the subsonic range. Thus, subsonic currents do not appear in the load on secondary 334 of output transformer 355.

Figure 4:
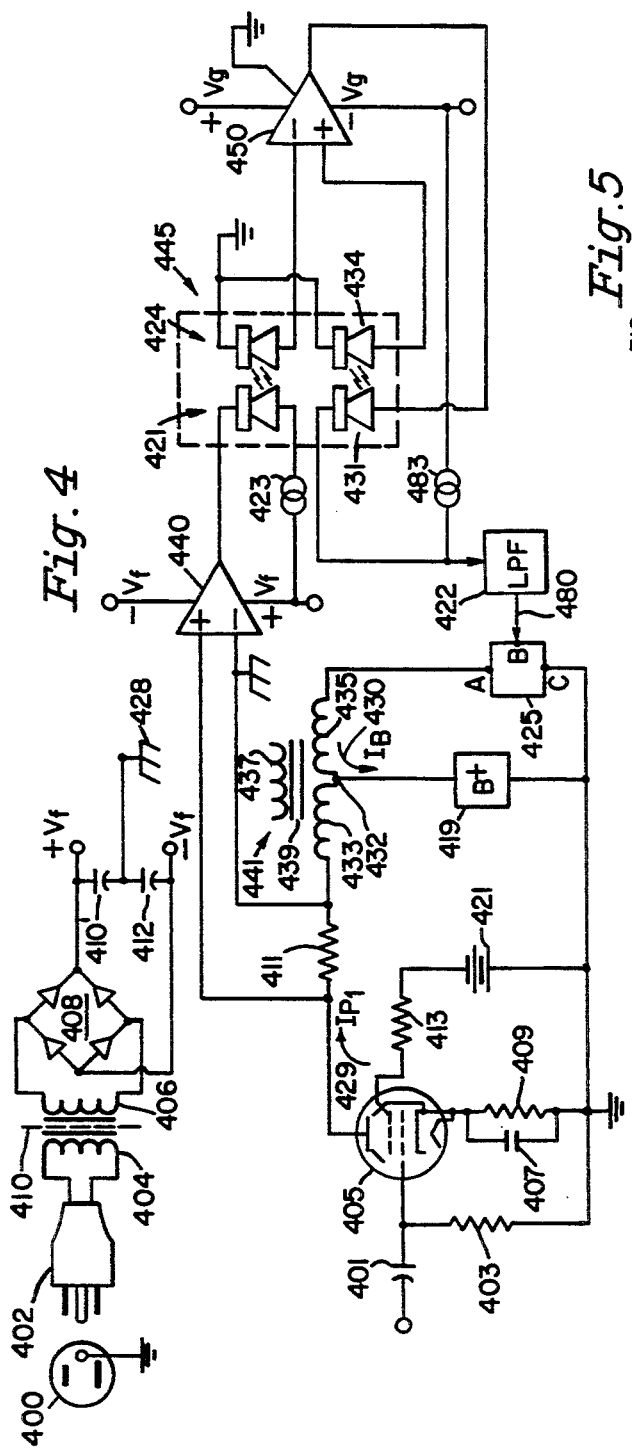
FIG. 4 illustrates phontonic means of isolation from the anode voltage. In this case, the optic transmitter is on an isolated deck that floats at the anode potential whereas the optic receiver is at ground potential. The optic link may use linear or digital encoding of the anode current to provide the control voltage to the current regulator.

FIG. 4 is a second preferred embodiment where the problem of isolation from high anode voltages is solved by photonic means. Amplifier 405 is cathode self biased by RC network 409/407, with anode bias supply 419, and screen bias 421 acting through screen resistor 413 to establish a quiescent plate current 429 in first primary coil 433 wound on core 439 of output transformer 441. Signal voltages are coupled to the control electrode of 405 via RC network comprised of capacitor 401 and resistor 403.

The differential voltage drop across resistor 411 becomes the control voltage applied to terminal B of voltage controlled current regulator 425 after low-pass filter 422. The high side of sense resistor 411 becomes the common point of floating deck 428. The floating deck 428 is comprised of an isolation transformer with primary 404 having insulation 410 to secondary 406 sufficient for at least two times the anode voltage provided by supply 419. Primary 404 is energized by ordinary three wire mains provided by plug 402 and socket 400. Floating deck secondary 406 is connected to a full wave rectifier 408 filtered by capacitors 410 and 411 for the floating, dual, DC supplies needed for the op amp 440, LED transmitter 421, and current source 423. The center point of these dual supplies is connected to floating deck common 428.

The differential voltage drop across resistor 411 in the plate lead of amplifier 405 is proportional to the plate current in amplifier 405. The voltage follower 440 therefore behaves as a difference amplifier since its inverting input is on floating deck common 428. Difference amplifier 440 modulates the light emitted from photo-transmitter LED 421 which is forward biased by current source 423 wherein both are referenced to floating deck common 428. Said optic link is preferably operated in the linear mode. That is, one coupler comprised of LED 421 referenced to floating deck 428 and receiver 424 referenced to ground are linearized by another coupler comprised of LED 431 and receiver 434 in the feedback loop of op amp 450, all referenced to ground. The LED of photo-transmitter 431 is forward biased with current source 483 referenced to ground. Modulation of photo-transmitter 431 is buffered by low pass filter 422 which is configured as an overall non-inverting amplifier with gain of unity. Dual optoisolator 445 thus provides a ground referenced control voltage 480 to control terminal B of three terminal current regulator 425 configured as described for assembly 375 in FIG. 3. The high side of second primary coil 435 is connected to bias supply 419 whereas the low side of coil 435 is connected to terminal A of three terminal current regulator 425 via center tap 432. Voltage controlled current regulator 425 causes a current 430 to flow in coil 435 in opposition to anode current 429 flowing in coil 433 wherein both primary coils are wound on core 439 of output transformer 441 with their high ends connected to form center tap 432 connected to anode supply 419. The product of current and turns are equal and opposite in primary coils 433 and 435. In accordance with the principles described for FIG. 3, the result is magnetic cancellation of magnetomotive force due to bias current 429 in coil 433 on core 439 via bucking current 430 to create an equal and opposite magnetomotive force in coil 435 also wound on core 439. Current 430 tracks current 429 over a range of frequencies determined by low pass filter 422, generally the cut-off is selected in the subsonic range. Thus, subsonic currents do not flow in the load connected to secondary 437 of transformer 441.

Figure 5:
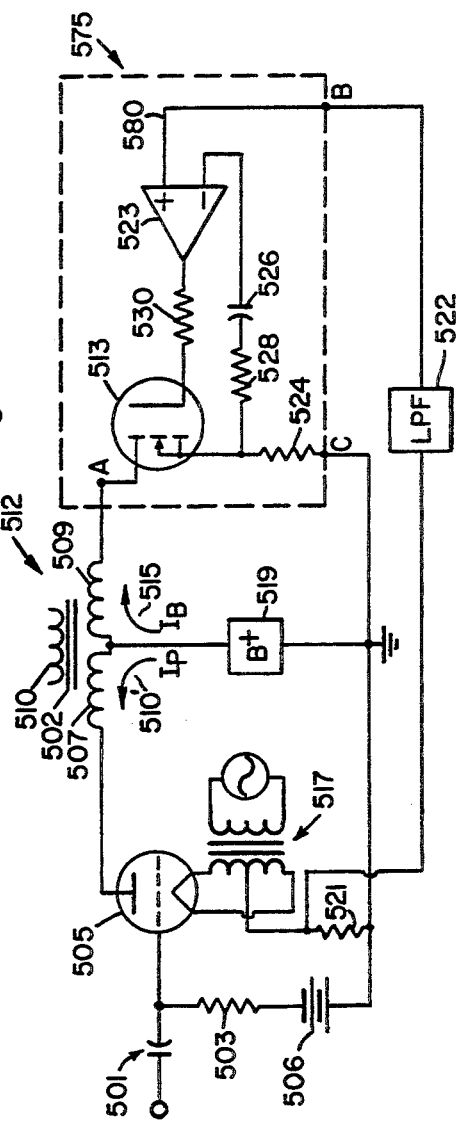
FIG. 5 illustrates current sensing in the cathode of a single ended amplifier with a triode final stage. This location of the sense resistor avoids the complication of voltage isolation since cathode potentials are often within the common mode range of the operational amplifiers used to process the voltage control signal. It is understood that the final stage is operated in class $A_1$ (no grid current); since there are no other electrodes, the cathode current is identical to the anode current that flows in first coil of the output transformer primary. The control signal thus derived for the bucking coil will accomplish cancellation of magnetomotive force in the output transformer.

FIG. 5 illustrates practice of the invention to a single ended amplifier with a triode output stage operated in class $A_1$, i.e. no positive grid current is allowed to flow. The grid drive is RC coupled to triode 505 via coupling capacitor 501 and grid resistor 503. Grid bias is obtained from bias supply 506 which, in combination with anode supply 519, determines bias current 510. Shown as a conventional current, 510, it flows from anode supply 519 to ground through first primary coil 507. The bias current 510 induces a voltage across sense resistor 521 in series with the filamentary cathode of 505 at the center tap of filament transformer 517. Since this voltage is referenced to ground, the control voltage for current regulator 575, as well as low pass filter 522, are also ground referenced. The control voltage 580 from low pass filter 522 is applied at terminal B to the noninverting input of op amp 523. The voltage developed across sense resistor 524, returned to ground at terminal C and connected to the source of N channel MOSFET 513, is applied to the inverting input of op amp 523. The lag network 526 and 528 limits the band-width of op amp 523 for loop stabilization. Resistor 530 limits gate drive to MOSFET 513 which acts as a series pass element via connection of its drain to the low end of coil 509. Thus, the voltage control causes the current regulator 575 to sink a bucking current 515 from anode power supply 519 through second primary coil 509 via current regulator 575 to ground. With equal amp-turns on the two primary coils, 507 and 509, on core 502 of output transformer 512 equal but opposite magnetomotive forces cancel in the primary of output matching transformer 512. The cut-off frequency of low pass filter 522 determines the subsonic signals subject to such cancellation thus preventing subsonic currents in secondary 510 of output transformer 512.

Use of the Invention

At least two primary coils in an output matching transformer primary are used to produce equal and opposite magnetomotive force in the same ferromagnetic core. One primary coil carries the signal and bias currents and the second coil carries only the bucking current to accomplish magnetic cancellation of the out-of band anode current that flows in the first coil.

Preferred embodiments differ on the basis of three broad, design considerations: choice of the final stage amplifier device; choice of means to sense bias and out-of-band currents that flow in the signal coil; and choice of means to implement current regulation in the bucking coil. With respect to choice of the final stage amplifier device, the first distinction is that between vacuum tubes and solid state electronic semiconductors. In broad terms, the source impedance of the final stage, and hence the impedance of the first primary winding, is much lower for bipolar junction transistors (BJT) and MOSFETs in common emitter and common source circuits, respectively than for tubes in common cathode circuits. Thus, the turns ratio is smaller by one to two orders of magnitude for solid state than for tube output matching transformers. Furthermore, both BJT and MOSFETS require lower voltages in the output transformer than tubes.

With respect to vacuum tubes, the output matching transformer may be placed within the plate or cathode circuit. The cathode location offers the possibility of lower source impedance, but the advantage is offset by lower voltage gain and higher drive requirements. The instant invention may be applied, however, to either location of primary windings in the output transformer.

At least two means may be used to sense the bias and subsonic current in the first coil: a sense resistor or a magnetic field sensor. The latter may include, but is not limited to, Hall effect sensors or a magnetic amplifier.

A sense resistor is easily used with solid state amplifier devices in the final stage of single ended amplifiers insofar as typical collector or drain voltages are within the common mode voltage of many operational amplifiers. A still simpler arrangement places the sense resistor in the emitter or source where the control signal may be ground referenced and closely replicates bias (or subsonic) currents in the first coil of the output matching transformer to control the current regulator in series with the bucking coil.

An isolation amplifier is advantageous for the high anode voltages associated with power electron tubes since no galvanic connection exists between the anode terminal and the control voltage for the current regulator. Isolation may be implemented by magnetic, capacitive or photonic means, as is well known to those skilled in the art. Such isolation is often provided by various modulation/demodulation schemes. Photonic isolation may also be operated in the linear mode. This is advantageous not only from the perspective of cost, but also for ease of tracking anode currents to control the current regulator for the bucking coil. Linear use of optic couplers is discussed in Hewlett Packard application note 951-2, which is well known to those skilled in the art of photonics. The method described therein depends upon two optic couplers with similar electro-optic characteristics. One pair that carries the data is linearized by a second pair in the feedback loop of an op amp used to buffer the first pair. Linearity in the range of $\frac{1}{2}\%$ has been achieved by this means in working examples of the instant invention. A still better method uses one LED transmitter that illuminates two receivers. Thus, the requirement for matched light sources is circumvented. One receiver is dedicated to signal while the other is for linearization. The isolated output voltage becomes the control signal for the current in the bucking coil after suitable low pass filtering.

Alternatively, a sense resistor may be employed in series with the cathode of electron tubes when cathode current is equal to anode current. This situation exists in triodes operated without positive grid current. This is a common configuration in high fidelity amplifiers. The benefits include reduction of the cost and complication of the means to generate the control signal for the current regulator. Two variations exist based on whether the cathode is directly or indirectly heated. The latter case provides electrical isolation between the cathode and the heater. In the case of a directly heated cathode, two further divisions depend upon AC or DC heater supplies. AC heaters require either an accurate (i.e., <1% imbalance) center tap or a resistive divider on the heater transformer. The high end of the current sensing resistor is placed at this center with the low end at ground. In the case of a DC heater supply, the DC supply is floated above ground by the voltage drop across the current sensing resistor (nominally $\frac{1}{2}$ Volt). That is to say, the high end of the current sensing resistor is connected to the low side of the DC heater supply.

Current sensing in the cathode alone cannot be employed with beam power tubes because cathode current includes anode plus screen grid as well as any control grid current. Additional signal processing can deduce the anode current component of the total cathode current.

In order to reduce power supply requirements, it is advantageous that the instant invention be embodied with unequal windings in the signal and bucking coils. Since the objective is magnetic cancellation via equal but opposite magnetomotive force, less current for the bucking coil can be compensated by greater number of windings. Furthermore, since the high frequency limitations normally associated with more turns are not pertinent to the band width of the bucking coil, there is no need to interleave windings on the bucking coil. In principle, doubling the number of windings on the bucking coil will allow reduction of current in that coil by one-half. Of course, the sense resistor value must be adjusted.

The current regulator is preferably configured as a series pass element with feed-back to track variations in the quiescent and out-of-band currents in the first coil as operational conditions vary. The bandwidth of the tracking so obtained is determined by the cut-off frequency of the low pass filter which serves as the dominant pole of the loop. This cut-off frequency should be selected to not intrude on the pass-band. The series pass element is preferably a MOSFET operated in common-source configuration. The same bias voltage used for the final amplifier stage is connected to the drain of the MOSFET. A low ohmic sense resistor in the source lead generates a voltage used to correct drive to the MOSFET gate to insure that the source current complies with the control voltage. The final current in the second (bucking) coil is calibrated such that amp-turns, assuming equal core areas, result in equal and opposite magnetomotive force in the same core as that produced by the bias and subsonic currents of the amplifier flowing in the first coil. The circuit values are selected to provide the same voltage/mA of current at each op-amp input. Temperature drift of this topology is determined by the temperature coefficient of the op amp input off set voltage and the tempco of the sense resistor. With proper part selection, this can be reduced to 1/10%.

Alternatively, the current regulator may be a thermionic diode operated in the space charge limited zone. This method permits higher anode voltages without the need to operate MOSFET devices in series. It has the disadvantage, however, that response time is very slow due to the need to change emission. Along those lines, it may be advantageous to use a triode thermionic device as the current regulator. This is more expensive than a thermionic diode, but voltage stand-off is comparably high and response time is much shorter.

Subsonic anode currents may lead to excessive flux density in the output coupling transformer. Since flux density is related directly to drive voltage and inversely to frequency, subsonic signal voltages may shift the hysteresis loop. Subsonic signals may also be derived from changes in quiescent current as operational points respond to either input signals or drift of bias voltages and currents. These out-of-band anode currents may also be magnetically cancelled in the output transformer core by the noninverting, voltage controlled, current regulator with various realizations of the low pass filter interposed between the current sensor and the control voltage circuits. Both the cut-off frequency and roll-off rate of said low-pass filter can be so tailored to accomplish magnetic cancellation over a band of subsonic signals. These as well as the bias current and its drift are likewise magnetically cancelled via the bucking coil.

What is claimed is:

1. A single ended audio amplifier comprising:
   a. an output matching transformer with at least a first and a second primary coil and at least one secondary coil all wound on the same ferromagnetic core to provide mutual inductance;
   b. means to control quiescent and signal current in a first of said primary coils by at least one final stage amplifier device;
   c. control voltage means to generate a control voltage to represent current in a first of said primary coils;
   d. voltage controlled current regulator means operantly connected to a second of said primary coils to produce in said second primary coil magnetomotive force equal but opposite to magnetomotive force in said first primary coil according to said control voltage.

2. Apparatus in claim, 1 wherein said first and second primary coils are
   a. wound with any given turns ratio;
   b. connected to at least one power supply such that opposing current paths exist in said second and said first primary coil.

3. Apparatus in claim 1 wherein said control voltage means is a current sensing resistor through which current flow is substantially equal to that in said first primary coil.

4. Apparatus in claim 3 wherein said resistor is on the low side of said final stage amplifier to result in a single ended, ground referenced, control voltage for said voltage controlled current regulator.

5. Apparatus as in claim 3 wherein said resistor is on the high side of said final stage amplifier to result in a differential, floating control voltage assembly for said voltage controlled current regulator.

6. Apparatus as in claim 5 wherein said differential, floating control voltage is an assembly comprised of said resistor, a differential amplifier, and voltage isolation means to translate said floating control voltage to a ground referenced control voltage.

7. Apparatus as in claim 6 wherein said voltage isolation means is an optocoupler.

8. Apparatus as in claim 6 wherein said voltage isolation means is an isolation amplifier.

9. Apparatus as in claim 1 wherein said voltage controlled current regulator is a sink for conventional current comprised of not less than three terminals: a control terminal operantly connected to said control voltage, a second terminal connected to the low end of a second of said primary coils, and a third terminal connected to power supply common.

10. Apparatus as in claim 9 wherein said three terminal, voltage controlled current regulator is a servo-loop comprised of a series pass element, a second current sensor connected to said second coil and an operational amplifier operantly connected in a local feedback loop to regulate current in said second primary coil to minimize the difference between sensed currents in said first and second coils within the limits of component accuracy and band width of said feedback loop.

11. Apparatus as in claim 10 wherein said series pass element is an electronic semiconductor.

12. Apparatus as in claim 10 wherein said band width extends from DC to a selectable subsonic cut-off frequency.

* * * * *